United States Patent
Kublak et al.

[11] Patent Number: 5,577,092
[45] Date of Patent: Nov. 19, 1996

[54] CLUSTER BEAM TARGETS FOR LASER PLASMA EXTREME ULTRAVIOLET AND SOFT X-RAY SOURCES

[76] Inventors: Glenn D. Kublak, 124 Turquoise Way, Livermore, Alameda County, Calif. 94550; Martin C. Richardson, CREOL; University Central Florida, 12424 Research Pkwy., Orlando, Orande County, Fla. 32826

[21] Appl. No.: 378,426

[22] Filed: Jan. 25, 1995

[51] Int. Cl.⁶ .................................. H01J 35/26
[52] U.S. Cl. .......................... 378/119; 378/143
[58] Field of Search ...................... 378/119, 120, 378/143, 123, 34

[56] References Cited

U.S. PATENT DOCUMENTS

| | | | |
|---|---|---|---|
| 4,042,848 | 8/1977 | Lee | 378/119 X |
| 4,494,043 | 1/1985 | Stallings et al. | 378/119 X |
| 4,538,291 | 8/1985 | Iwamatsu | 378/119 |
| 4,644,576 | 2/1987 | Kuyel | 378/119 |
| 4,723,262 | 2/1988 | Noda et al. | 378/119 |
| 4,837,793 | 6/1989 | Frankel et al. | 378/34 |
| 4,866,517 | 9/1989 | Mochizuki et al. | 378/119 |
| 4,872,189 | 10/1989 | Frankel et al. | 378/119 |
| 4,969,169 | 11/1990 | Forsyth et al. | 378/34 |
| 5,151,928 | 9/1992 | Hirose | 378/119 |

FOREIGN PATENT DOCUMENTS

| | | | |
|---|---|---|---|
| 63-304597 | 12/1988 | Japan | 378/119 |
| 1368924 | 1/1988 | U.S.S.R. | 378/119 |

OTHER PUBLICATIONS

Fiedorowicz, H. et al. Proceedings of the Thirteenth International Congress, UMIST, Aug. 31–Sep. 4, 1992; pp. 515–518 "Laser Plasma X–Ray Source with a Gas Puff Target".
McPherson, A. et al. Applied Physics B v. 57; pp. 337–347 (1993) "Multiphoton–Induced X–Ray Emission and Amplification from Clusters".
McPherson, A. et al. Physical Review Letters, v. 72 (12); pp. 1810–1813 (1994) "Multiphoton Induced X–Ray Emission from Kr Clusters on M–Shell (~100 A) and L–Shell (~6A) Transitions".
Inoue, T. et al. Journal of Chemical Physics v. 92 (1); pp. 162–169 (1989) "Formation of Water Clusters in a Free Molecular Jet of Binary Mixtures".

*Primary Examiner*—David P. Porta
*Attorney, Agent, or Firm*—Timothy D. Stanley; Gregory A. Cone; Donald A. Nissen

[57] ABSTRACT

Method and apparatus for producing extreme ultra violet (EUV) and soft x-ray radiation from an ultra-low debris plasma source are disclosed. Targets are produced by the free jet expansion of various gases through a temperature controlled nozzle to form molecular clusters. These target clusters are subsequently irradiated with commercially available lasers of moderate intensity ($10^{11}$–$10^{12}$ watts/cm²) to produce a plasma radiating in the region of 0.5 to 100 nanometers. By appropriate adjustment of the experimental conditions the laser focus can be moved 10–30 mm from the nozzle thereby eliminating debris produced by plasma erosion of the nozzle.

37 Claims, 4 Drawing Sheets

CLUSTER BEAM TARGETS FOR LASER PLASMA EXTREME ULTRAVIOLET AND SOFT X-RAY SOURCES

STATEMENT OF GOVERNMENT INTEREST

The government has rights in this invention pursuant to contract no. DE-AC04-94AL8500 between the U.S. Department of Energy and Sandia Corporation.

BACKGROUND OF THE INVENTION

This invention relates generally to the production of electromagnetic radiation in the region of 0.5–100 nanometers by the irradiation of target materials with high energy laser beams and more particularly to production of the target materials.

The generation and use of extreme ultraviolet (EUV) radiation has wide applicability in the fields of materials science, microlithography and microscopy. Two frequently used sources of such radiation are a laser-produced plasma and synchrotron radiation. With appropriate modification laser plasma sources are as bright as their more expensive synchrotron counterparts, but are better suited to a small laboratory or commercial environment.

While laser plasmas are efficient EUV sources, they are plagued by the problem of unacceptably high production of damaging atomic and particulate debris which arises as a consequence of the method of producing the plasma. The ejection of such debris limits the applicability of plasma sources. Laser plasma sources typically employ planar solid metal targets that are irradiated with pulsed lasers at incident intensities in the range of $10^{11}$–$10^{13}$ watts/cm$^2$. Under these conditions, the laser creates a 10–100 eV plasma above the target surface. The hot expanding plasma may exert pressures greater than 100 kilobar back onto the target, leading to melting and/or fragmentation of the target and the ejection of fast, hot particulate matter. These ejecta range in dimensions from atomic size to greater than 10 micrometers in diameter. The atomic size ejecta are effectively stopped from damaging nearby optics by the use of low pressure gases. In contrast, the large particulate ejecta, which can travel at speeds up to $10^5$ cm/sec are very difficult to block or divert. This debris adheres to and/or erodes nearby solid surfaces and is thus extremely deleterious to optics and other instrumentation placed near the plasma. The magnitude of this problem is illustrated by the fact that as little as 150 Å of a typical target material such as gold deposited on a multi-layer-coated mirror will reduce its reflectance to 13% of the original value. Because a "zero-debris" laser plasma source of EUV and soft x-ray radiation would expand greatly the applicability of these sources to commercial and scientific applications which cannot tolerate debris-induced damage, there has been a concerted effort to develop debris mitigation methods as well as novel target geometries to reduce or eliminate this problem.

One method of mitigating this problem is to place optics at certain angles with respect to the laser plasma target surfaces thereby reducing the exposure to debris. Another strategy for reduction of energetic target debris is the use of "mass-limited" targets. U.S. Pat. Nos. 4,872,189, 4,837,793 and 5,151,928 disclose target geometries in which tapes or ceramic membranes support thin metal films thus limiting the volume of target material exposed to the laser beam thereby reducing, but not eliminating, the total amount of debris ejected. However, these tape systems are difficult to construct and prone to breakage necessitating opening the vacuum system and interrupting operation of the system. U.S. Pat. No. 4,866,517 discloses the use of cryogenic solid targets to avoid the formation of condensable solid debris. These targets are made from frozen inert or rare gases such as krypton, or xenon. Because of the cost involved in the use of these gases an elaborate containment and recovery system is necessary in order to keep the costs below $10$^{-6}$ per shot. U.S. Pat. No. 4,723,262 discloses the use of discontinuous droplets of a metal having a melting point below 100° C., such as mercury, gallium, indium, cesium or potassium, as the target material. In order to minimize the production of debris the droplets are sized to correspond to the size of the laser plasma beam. This requires elaborate control equipment as well as means for heating those metals whose melting points are greater than 25° C. The production of some target debris is inevitable. Furthermore, because of the low vapor pressure of these materials at room temperature, they will tend to condense on optical components causing losses in optical properties. The use of fast mechanical shutters and magnetic shutters, as described in U.S. Pat. Nos. 4,866,517 and 4,969,169, has also been proposed to block or divert debris, however, they are known to be only marginally effective because of the speeds at which the ejecta travel. None of these schemes has demonstrated the ability to simultaneously achieve significant debris reduction while maintaining adequate source brightness or collection solid angle.

Another scheme has been used to generate laser plasma targets; free-jet expansion of gases. Hot, dense plasmas have been produced by high power laser interaction with small gas clouds, or clusters, formed by pulsed injection of gas through a nozzle (free-jet expansion) into a vacuum chamber. Results of an experimental investigation into x-ray generation from Nd3+:YAG laser-irradiated free-jet expansion gas targets indicated that this technique could be used to produce intense soft x-ray emission (Laser plasma x-ray source with a gas puff target, H. Fiedorowicz, A. Bartnik, P. Parys, and Z. Patron, Inst. Phys. Conf. Ser. No 130, Chpt. 7, p 515, IOP Publishing Ltd., 1993, and SPIE 1994). In the work of McPherson, et al. (Applied Phys. B 57, p 337, 1993, Phys. Rev. Lett. 72, p 1810, 1994), clusters were used to study the mechanisms of x-ray production where extremely high laser intensity, $5\times10^{16}$–$8\times10^{18}$ watts/cm$^2$, short-pulse (300 femtoseconds) laser sources were used to produce cluster-enhanced x-ray emission. It has been demonstrated that clusters do provide benefits in the direct multiphoton induced emission of specific x-ray transitions. However, there has been no work reported in which it has been demonstrated that the use of molecular clusters can result in minimization of plasma debris while at the same time serve as efficient targets for the generation of EUV or soft x-rays where traditional laser plasma heating schemes are used.

SUMMARY OF THE INVENTION

We disclose an new concept for producing an ultra-low debris laser plasma source which is based on the irradiation of targets by commercially available laser sources of moderate intensity ($10^{11}$–$10^{12}$ watts/cm$^2$) where the targets are made up of large clusters of molecules produced by supersonic expansion of gases through a nozzle and held together by van der Waals forces. The specific advantages inherent in this invention, in addition to the fact that in operation it yields many orders of magnitude less debris than more conventional laser plasma sources, is that it has a long life of uninterrupted operation by virtue of the fact that periodic replacement of spent target materials, such as metal tape or drum targets, or cleaning and/or replacement of optical components is not required, inexpensive target materials may be used, there is an almost continuous supply of target materials and it permits laser focus far from the nozzle orifice further reducing debris.

It is well known to those skilled in the art, that the supersonic expansion of a gas, under isentropic conditions, through a nozzle from a region of high pressure to one of lower pressure causes the temperature of the gas to drop. As the temperature of the gas drops the relative intermolecular velocity of the gas decreases and the weakly attractive van der Waals forces that exist between molecules cause condensation of the expanding gas with the subsequent formation of molecular clusters, for example dimers, polymers and eventually droplets. The formation of molecular clusters is a crucial element in efficient laser absorption, subsequent laser heating and EUV production. These clusters, aggregates of atoms or molecules, will respond locally like microscopic solid particles from the standpoint of laser plasma generation. Each cluster has an electron density well above the critical density necessary for efficient absorption of laser energy. In the absence of these clusters, the density of the gas jet at distances 10–30 mm from the orifice is so low that laser energy is not absorbed and a plasma will not be formed. The gas ;pressure in the laser focal volume required to achieve the critical density of targets necessary for complete laser absorption in, for example, water vapor would be nearly 100 atmospheres.

In order to increase both the total pressure before expansion and the number of clusters, a diluent gas, such as Ne or At, may be added to the gas mixture. A ternary gas, such as Ne, Ar or Kr, may be added to the mixture to optimize the collisional energy transfer in order to produce large molecular clusters so that each cluster has an electron density at least as great as the critical density necessary for complete laser radiation absorption.

By adjusting the conditions for cluster formation appropriately the clusters will retain their integrity at significant distances away from the orifice. Experiments have shown that the laser focus can be moved 10–30 mm away from the nozzle orifice and still allow the laser light to be efficiently absorbed by the plasma created around each cluster. The advantages of moving the laser focus far from the nozzle orifice are decreased debris production and better differential pumping to reduce x-ray attenuating gaseous products produced by the jet.

By appropriate selection of operating conditions, an infrared laser can be used to efficiently generate EUV radiation. The use of an infrared laser has specific benefits because the required gas density necessary to achieve good x-ray generation is reduced due to the fact that the critical plasma density for efficient laser coupling decreases with the inverse square of the laser wavelength.

Accordingly it is an object of this invention to eliminate the production of target debris by the use of molecular clusters. It is another object to form these targets by supersonic expansion of gases through a nozzle. It is yet another object to employ gases which are efficient radiators in the spectral region 0.5–100 nanometers and which will form large molecular clusters. Yet another object is to produce the desired EUV or soft x-ray radiation efficiently in the desired bandwidth using an infra red laser. Still yet another object is to use materials that have high vapor pressures at room temperature to form the clusters in order to eliminate condensation on critical optical components and a consequent loss in optical properties. A further object is to move the laser focus far from the orifice of the nozzle used to produce the molecular clusters in order to decrease debris formation and provide better differential pumping to reduce x-ray attenuating gaseous products.

These and other objectives of this invention are achieved by the supersonic expansion of gases through an orifice to form molecular clusters which are subsequently irradiated by a laser source to generate EUV or soft x-ray radiation.

The objectives of the present invention together with the advantages thereof over existing prior art forms which will become apparent to those skilled in the art from detailed disclosure of the present invention as set forth hereinbelow, are accomplished by the improvements herein described and claimed.

BRIEF DESCRIPTION OF THE DRAWINGS

The accompanying drawings, which are incorporated in and form part of the specification, illustrate the present invention and, together with the description, explain the invention.

DETAILED DESCRIPTION OF THE INVENTION

Figure 1:
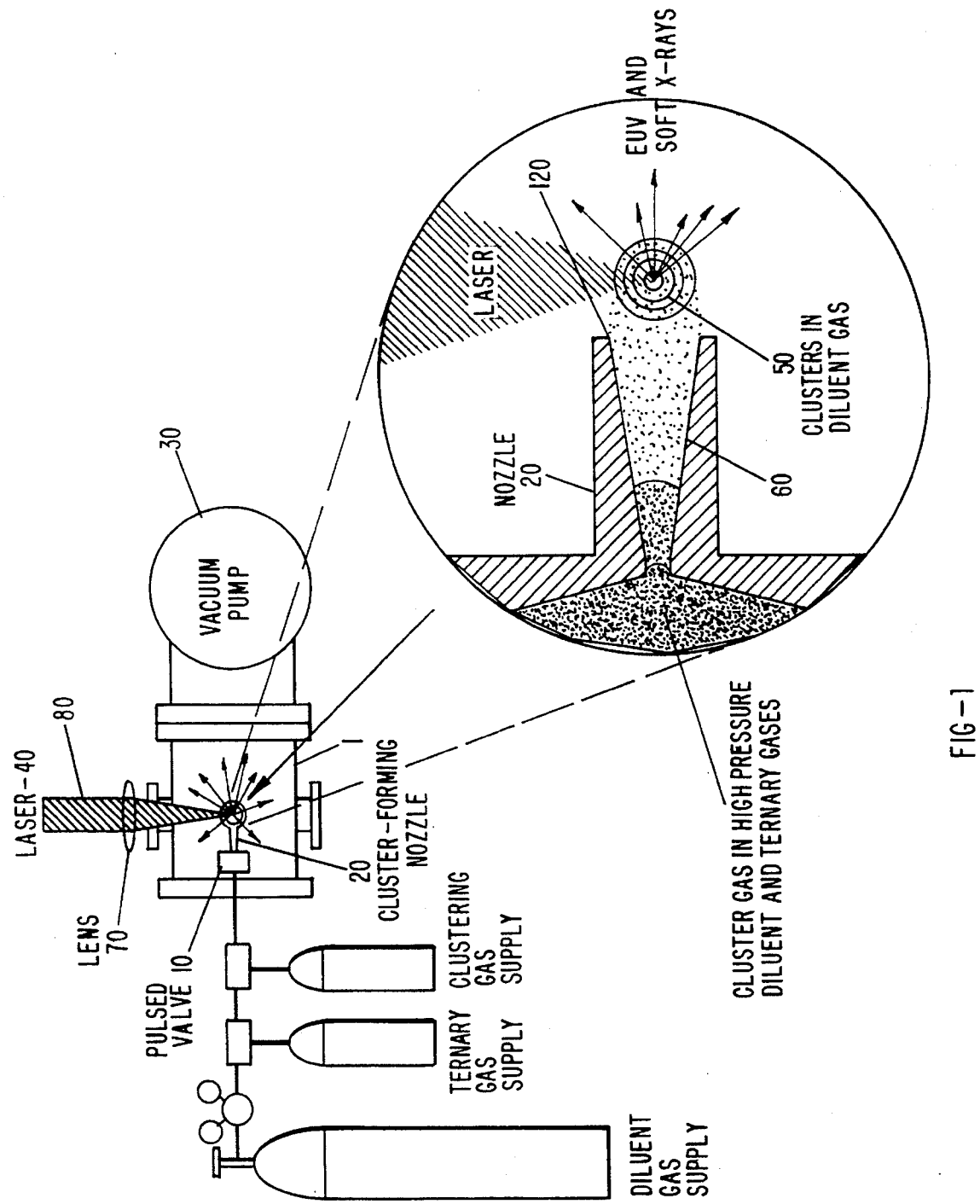
FIG. 1 is a schematic diagram which illustrates the basic concept of molecular cluster target formation and is a preferred embodiment of the apparatus.
Figure 2:
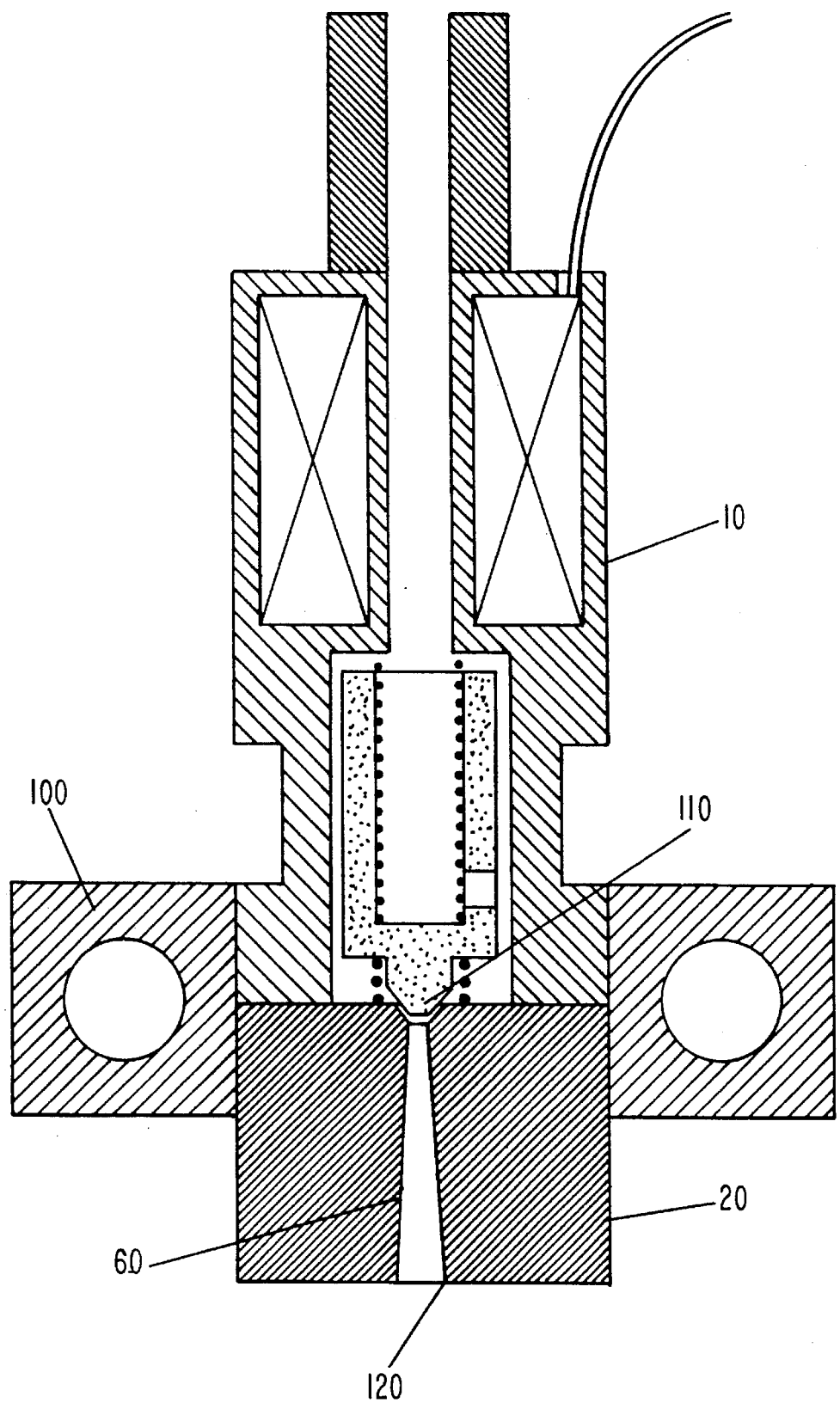
FIG. 2 shows a specific embodiment of a pulsed valve for producing gas clusters.

This invention replaces the conventional method of producing EUV or soft x-rays, the irradiation of macroscopic solid targets by a pulsed laser source, by the supersonic expansion of gases into a vacuum generating van der Waals clusters which serve as a renewable source of zero-debris targets. FIG. 1 illustrates the apparatus and method for producing van der Waals cluster targets. Here, a gas mixture, at a pressure of from 10–100 atmospheres, composed of a cluster forming gas, a diluent gas and a ternary gas is lead to a valve 10 which may be continuously open or alternatively open and closed The background pressure of the expanding gas in the vacuum chamber 1 through which the x-rays must pass to reach the point of application should be kept to a minimum. To reduce the pumping speed requirements on the vacuum pump 30 and achieve the lowest background gas pressure, a pulsed valve may be employed. This valve may be, but is not limited to, a solenoidal, piezoelectric diaphragm, or repelling current loop design. A solenoid valve 10 embodiment is shown schematically in FIG. 2. In this particular embodiment, a standard solenoid valve is fitted with a nozzle 20 designed to achieve efficient cluster production. The gas in nozzle 20 is cooled to temperatures within 10–20% above its sublimation or boiling point by means of a yoke 100 fitted onto valve 10 in order to achieve efficient cluster production. In a preferred embodiment, a long tapered nozzle is employed since it is known that this shape maximizes the size of the clusters produced. To further increase the production of large clusters, the orifice 60 within nozzle 20 has a conical shape, approximately 25 mm long with a full opening angle of ~10 degrees. The entrance of this cone on the high-pressure side 110 is ~1 mm with the exit 120 being ~5.4 mm. The inside walls of this conical nozzle should be as smooth as possible to avoid the deleterious effects of flow disruptions and diffuse scattering of the expanding gas flow. The gas pulse applied by this valve should be $\geq 30$ μs long to allow sufficient time for the development of stable flow and good cluster formation. In a preferred embodiment, the pulsed valve 10 acts in a synchronous fashion with the irradiating laser 40 having a open period of 1–2000 Hz. An expanding stream of gas clusters 50 is ejected from the pulsed valve orifice 60 by the pressure differential that exists between the pulsed valve 10 and the vacuum chamber 1. As the gas clusters 50 exit the valve orifice 60 they are irradiated by the pulsed laser 40 whose light 80 enters the vacuum and is been brought to a focus by lens 70 in the vicinity of the nozzle exit 120 to produce a plasma which emits EUV and soft x-rays. The radiation produced by interaction of the pulsed laser with the molecular clusters formed at the nozzle exit, as discussed earlier, vide supra, is focused onto a wafer or other material of interest by optical means well known to those skilled in the art.

Figure 3:
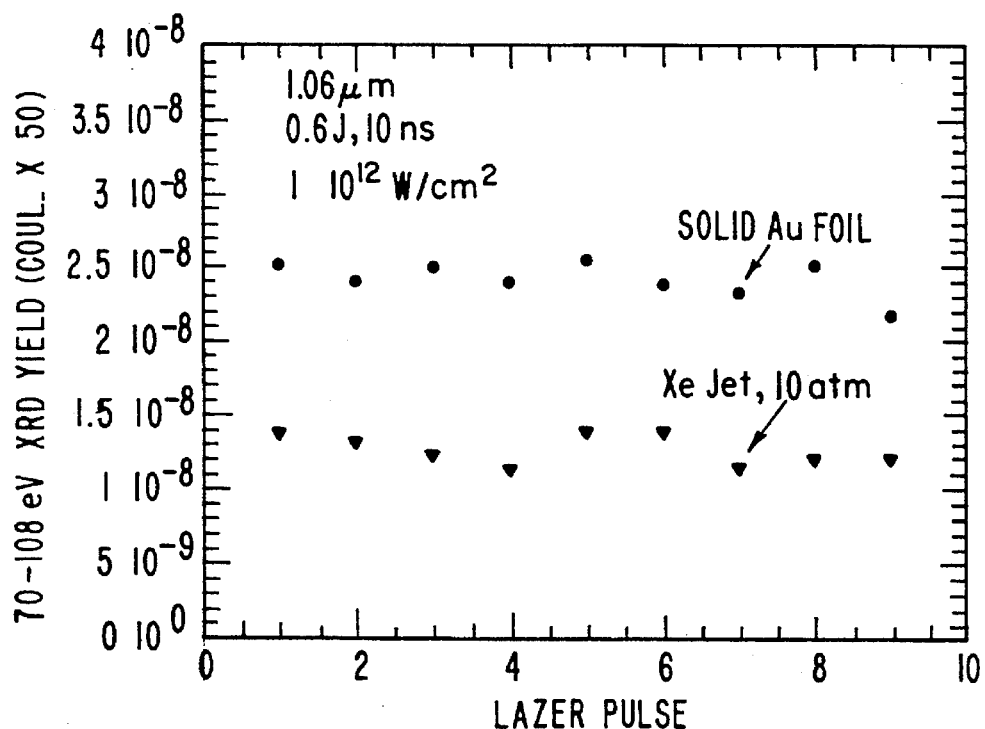
FIG. 3 shows Extreme Ultraviolet (EUV) radiation yields obtained in the 70–108 eV spectral band for a Xe jet compared with those obtained for a solid gold target.
Figure 4:
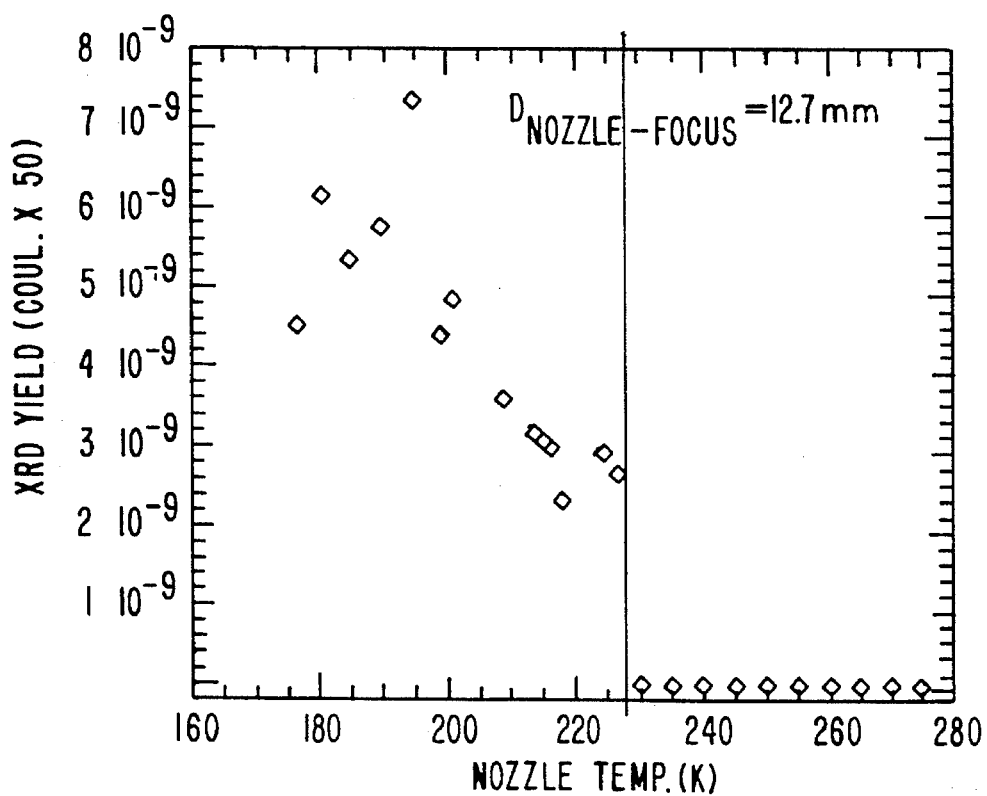
FIG. 4 shows the EUV radiation yields obtained in the 70–108 eV spectral band for a Xe jet at a distance of 13 mm from the nozzle orifice plotted as a function of nozzle temperature.
Figure 5:
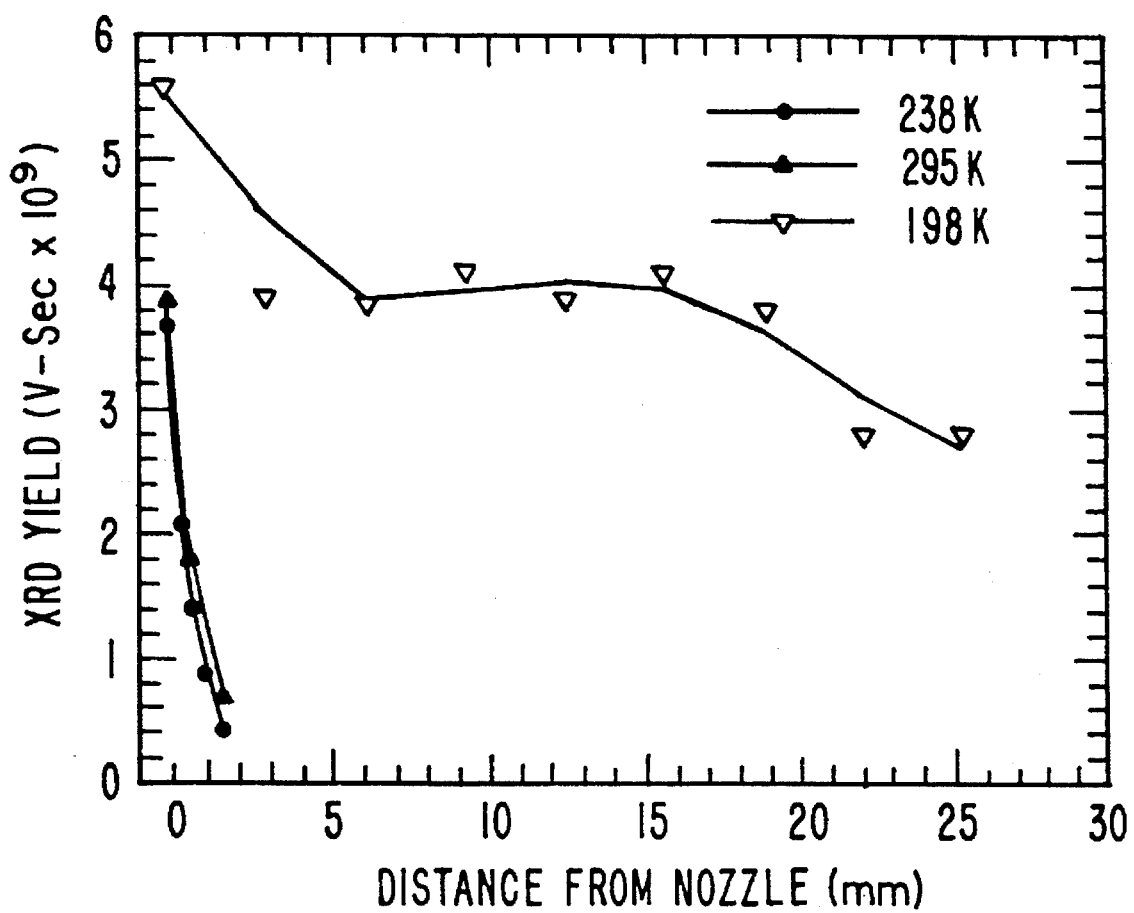
FIG. 5 shows EUV radiation yields obtained as a function of the separation distance between the nozzle and the laser focus as a function of nozzle temperature.

That the embodiments disclosed in this invention enhance the production of EUV radiation is shown in FIGS. 3–5. In FIG. 3 the EUV yield for Xe molecular gas clusters is .compared to that of a solid gold target, one of the most efficient laser plasma source targets but which produces unacceptable levels of debris. A radiation yield of $\approx 50\%$ of the gold value is achieved. FIG. 4 illustrates the effect of lowering the temperature of the pulsed valve nozzle on the production of molecular gas clusters. Here a Nd3+:YAG laser beam is focused $\approx 13$ mm from the nozzle orifice and onto a stream of Xe gas clusters. The yield of EUV radiation is measured as a function of nozzle temperature. As the temperature of the nozzle is lowered there is an abrupt increase in the yield of EUV radiation at $\approx 227$K, approximately 25% higher than the boiling temperature of Xe (167K), indicating the formation of molecular gas clusters.

As has been discussed earlier, vide supra, positioning the laser focus in close proximity to the nozzle orifice will result in increased debris formation due to the pressure wave exerted by the hot expanding plasma. Moving the laser focus a sufficient distance from the nozzle orifice will significantly decrease that effect and at the same time allow better differential pumping. The ability to move the laser focus away from the nozzle depends upon having a sufficient mass of target gas at distances removed from the nozzle orifice to form a plasma. That the molecular gas clusters formed by the process disclosed herein provide that capability is illustrated in FIG. 5. Here the EUV radiation yield for Xe gas is given as a function of distance from the nozzle orifice at different values of the nozzle temperature. When the nozzle temperature falls below the critical value for Xe (227K as shown in FIG. 4) EUV yield remains at 60% of its maximum value at laser focus distances of up to 20 mm from the nozzle orifice.

In order to produce wavelengths which may be useful for different applications various clustering reagents may be used such as, for example, H2O, CF4, CO2, HCl, F2, H2S, B2H6, O2, Ar and Xe. The wavelengths produced by such sources could extend anywhere from 0.5 to 100 nanometers as determined by the source gas selected. Furthermore, a mixture made up of cluster gases chosen from the examples listed above could be used to obtain an optimized combination of EUV and soft x-ray wavelengths.

A preferred embodiment of the use of a clustering gas for the production of EUV is the use of H2O vapor. He-like and Li-like oxygen ions produced by irradiation of bulk H2O by a laser intensity of $10^{12}$ watts/cm$^2$ radiate strongly in the spectral region of 11.4–18 nm. In this embodiment, a dilute mixture of H2O vapor (20–1000 Torr) in 5–10 atm of He and 10 vol % Ar is expanded through a 0.1 mm nozzle, maintained at a temperature of 375K, into a chamber maintained at a pressure of less than 1 tort causing the formation of $[H2O]_n$ clusters, where n is $\approx 5000$. This cluster is then irradiated by a 1.5 J 5–10 nanosecond Nd:YG or KrF eximer pulsed laser focused to a diameter of approximately 630 μm over a length of 1 mm, yielding an intraction volume of $\approx 3 \times 10^{-5}$ cm$^3$, to produce a 100 eV plasma of $O^{5+}$ radiating at 13 nm.

We claim:

1. A method for producing extreme ultra-violet and soft x-ray radiation, comprising the steps of:

flowing a gas mixture, said gas mixture comprising a cluster forming gas, a diluent gas and a ternary gas, into a pressurizable valve, said valve comprising;
a housing that defines a chamber,
an input channel that communicates with said chamber, said gas flowing through said input channel into said chamber,
an output channel communicating with said chamber, and
a temperature controlled nozzle, said nozzle having a gas entrance end, said gas entrance end being fixedly attached to said output channel and an opposite gas exit end, said nozzle having an orifice disposed within,
said valve being contained within a vacuum chamber;
pressurizing said gas mixture contained in said valve;
reducing the pressure in said vacuum chamber;
adjusting the temperature of said temperature controlled nozzle to a temperature appropriate for forming molecular gas clusters from the selected cluster forming gas;
forming molecular gas clusters by expanding said high pressure gas contained within said valve through said orifice into said vacuum chamber; and
irradiating said molecular clusters with a laser beam brought to a focus onto said clusters to produce radiation of a selected wavelength.

2. The method of claim 1, wherein said cluster forming gas comprises a gas which is an efficient radiator of spectral energy in the region of from about 0.5 to about 100 nanometers.

3. The method of claim 2, wherein the cluster forming gas comprises a gas which is an efficient radiator of spectral energy in the region of from about 11 nm to about 18 nm.

4. The method of claim 1, wherein the cluster forming gas is selected from the group consisting of water, carbon tetrafluoride, hydrogen chloride, fluorine, hydrogen sulfide, diborane, oxygen, argon, krypton and xenon.

5. The method of claim 4, wherein a cluster forming gas mixture is made by combining various cluster forming gases selected from the group consisting of water, carbon tetrafluoride, hydrogen chloride, fluorine, hydrogen sulfide, diborane, oxygen, argon, krypton and xenon.

6. The method of claim 1, wherein the diluent gas is selected from the group consisting of hydrogen, helium and neon.

7. The method of claim 1, wherein the ternary gas is selected from a group consisting of neon, argon or krypton.

8. The method of claim 1, wherein the pressure in said valve is at least as high as two atmospheres.

9. The method of claim 1, wherein the pressure in said vacuum chamber is at least as low as 1 Torr.

10. The method of claim 1, wherein said laser irradiates said molecular clusters with an intensity of at least $10^{11}$ watts/cm$^2$.

11. The method of claim 1, wherein said laser is a pulsed laser.

12. The method of claim 11, wherein said pulsed laser is selected from a group consisting of an infrared laser and an ultra-violet laser 13. The method of claim 11, wherein said pulsed laser irradiates said molecular clusters with an intensity of at least $10^{11}$ watts/cm$^2$.

14. The method of claim 11, wherein said pulsed laser irradiates said molecular clusters with a power of about 1 J for about 10 nanoseconds.

15. The method of claim 1, wherein said valve is a pulsed valve selected from the group consisting of solenoidal, piezoelectric diaphragm and repelling loop design.

16. The method of claim 15, wherein said pulsed valve has a open period of at least 30 µs.

17. The method of claim 16, wherein said pulsed valve has a open period synchronized with the firing rate of said pulsed laser.

18. The method of claim 1, wherein the temperature of said temperature controlled nozzle is from about 10% to 20% above the boiling or sublimation temperature of said cluster forming gas.

19. The method of claim 1, wherein said orifice has a conical shape, the axis of said cone being parallel to the flow of said gas mixture through said nozzle and, wherein the apex of said cone is located proximal to said gas entrance end of said nozzle.

20. The method of claim 19, wherein said conical orifice, disposed within said nozzle, having a length of approximately 25 mm and wherein the apex of said cone is about 1 mm in diameter and the base is about 5 mm in diameter.

21. The method of claim 1, wherein the focus of said laser beam is at least 10 mm from the exit of said nozzle.

22. A method for producing 13 nm radiation comprising the steps of:
producing molecular clusters of the form $(H_2O)_n$, where n is equal to at least 100, by supersonically expanding a mixture of water vapor, He and Ar,
wherein the pressure of water vapor is from about 20 to about 1000 torr, the concentration of Ar is about 10 vol % and the pressure of He is about 5 to 10 atm. through an orifice having a diameter of about 0.1 mm into a chamber having a pressure of less than about 1 Torr; and
irradiating said clusters with a Nd:YAG or KrF eximer pulsed laser, wherein said laser operates at a power of about1 J for about 10 nanoseconds.

23. An apparatus for producing an ultra-low debris generating laser plasma source of extreme ultra-violet and soft x-ray radiation by irradiating target materials made of large clusters of gas molecules with a laser, said clusters of gas molecules being produced by the supersonic expansion of a cluster forming gas through an orifice, comprising;
a pressurizable valve, said valve comprising;
a housing that defines a chamber,
an input channel that communicates with said chamber, said cluster forming gas flowing through said input channel into said chamber,
an output channel communicating with said chamber, and
a temperature controlled nozzle, said nozzle having a gas entrance end, said gas entrance end being fixedly attached to said output channel and an opposite gas exit end, said nozzle having an orifice disposed within, said orifice being configured to maximize the size of gas clusters produced by release of said gas from said chamber through said orifice;
a means for releasing said gas from said valve, said valve being contained within a vacuum chamber, said vacuum chamber being maintained at a lower pressure than said pressurization chamber;
means for pressuring said gas in said valve;
a laser for irradiating said clusters; and
means for focusing said laser onto said molecular gas clusters.

24. The apparatus of claim 23, wherein the pressure in said pressurizable valve is at least as high as two atmospheres.

25. The apparatus of claim 23, wherein the pressure in said vacuum chamber is at least as low as 1 Torr.

26. The apparatus of claim 23, wherein said laser irradiates said molecular clusters with an intensity of at least $10^{11}$ watts/cm$^2$.

27. The apparatus of claim 23, wherein said laser is a pulsed laser.

28. The apparatus of claim 27, wherein said pulsed laser is selected from a group consisting of an infrared laser and an ultra-violet laser.

29. The apparatus of claim 27, wherein said pulsed laser irradiates said molecular clusters with an intensity of at least $10^{11}$ watts/cm$^2$.

30. The apparatus of claim 27, wherein said pulsed laser irradiates said molecular clusters with a power of about 1 J for about 10 nanoseconds.

31. The apparatus of claim 23, wherein said valve is a pulsed valve selected from the group consisting of solenoidal, piezoelectric diaphragm and repelling loop design.

32. The apparatus of claim 31, wherein said pulsed valve has a open period of at least 30 µs.

33. The apparatus of claim 32, wherein said pulsed valve has a open period synchronized with the firing rate of said pulsed laser.

34. The apparatus of claim 23, wherein the temperature of said temperature controlled nozzle is about 10% to 20% above the boiling or sublimation temperature of the cluster forming gas.

35. The apparatus of claim 23, wherein said orifice has a conical shape, the axis of said cone being parallel to the flow of said gas mixture through said nozzle and, wherein the apex of said cone is located proximal to said gas entrance end of said nozzle.

36. The apparatus of claim 35, wherein said conical orifice, disposed within said nozzle, having a length of approximately 25 mm and wherein the apex of said cone is about 1 mm in diameter and the base is about 5 mm in diameter.

37. The apparatus of claim 23, wherein the focus of said laser beam is at least 10 mm from the exit of said nozzle.

* * * * *

UNITED STATES PATENT AND TRADEMARK OFFICE
CERTIFICATE OF CORRECTION

PATENT NO. : 5,577,092
DATED : November 19, 1996
INVENTOR(S) : Glenn D. Kubiak and Martin C. Richardson It is certified that error appears in the above-indentified patent and that said Letters Patent is hereby corrected as shown below:

On the title page, under item [19] and item [76], "Kublak" should read --Kubiak--.

Signed and Sealed this

Second Day of September, 1997

*Attest:*

BRUCE LEHMAN

*Attesting Officer*     *Commissioner of Patents and Trademarks*